United States Patent
Sugawa et al.

(10) Patent No.: US 11,541,468 B2
(45) Date of Patent: Jan. 3, 2023

(54) COATED TOOL AND CUTTING TOOL INCLUDING SAME

(71) Applicant: KYOCERA Corporation, Kyoto (JP)

(72) Inventors: Yuusaku Sugawa, Satsumasendai (JP); Yoshikazu Kodama, Nobeoka (JP); Kenji Kumai, Satsumasendai (JP); Takanori Sugiyama, Satsumasendai (JP); Hirotoshi Itoh, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 180 days.

(21) Appl. No.: 16/963,940

(22) PCT Filed: Jan. 28, 2019

(86) PCT No.: PCT/JP2019/002770
§ 371 (c)(1),
(2) Date: Dec. 30, 2020

(87) PCT Pub. No.: WO2019/146786
PCT Pub. Date: Aug. 1, 2019

(65) Prior Publication Data
US 2021/0114121 A1    Apr. 22, 2021

(30) Foreign Application Priority Data

Jan. 29, 2018  (JP) .............................. JP2018-012424
Mar. 29, 2018  (JP) .............................. JP2018-064523

(51) Int. Cl.
*B23B 27/14*     (2006.01)
*B23C 5/16*      (2006.01)
(Continued)

(52) U.S. Cl.
CPC .............. *B23C 5/16* (2013.01); *C23C 16/403* (2013.01); *C23C 28/044* (2013.01); *B23B 27/148* (2013.01); *B23C 2224/04* (2013.01)

(58) Field of Classification Search
CPC ......... B23B 27/14; B23B 27/148; B23C 5/16; C23C 16/36; C23C 16/403
(Continued)

(56) References Cited

U.S. PATENT DOCUMENTS

2013/0149527 A1   6/2013 Cho et al.
2015/0064453 A1   3/2015 Imamura et al.
(Continued)

FOREIGN PATENT DOCUMENTS

JP   2004-074324 A   3/2004
JP   2006-272515 A   10/2006
(Continued)

*Primary Examiner* — Archene A Turner
(74) *Attorney, Agent, or Firm* — Volpe Koenig

(57) ABSTRACT

A coated tool of the present disclosure is provided with a base member and a coating layer located on a surface of the base member. The coating layer includes a TiCNO layer and an $Al_2O_3$ layer. The $Al_2O_3$ layer is located in contact with the TiCNO layer at a position farther from the base member than the TiCNO layer is. The TiCNO layer includes a plurality of first protrusions that project toward the $Al_2O_3$ layer, and a beam that extends in a direction intersecting a direction in which the first protrusions project, to connect the first protrusions. A cutting tool of the present disclosure is provided with: a holder extending from a first end toward a second end and including a pocket on a side of the first end; and the above-described coated tool located in the pocket.

16 Claims, 7 Drawing Sheets

(51) Int. Cl.
*C23C 16/40* (2006.01)
*C23C 28/04* (2006.01)

(58) Field of Classification Search
USPC ........................................ 428/698, 701, 702
See application file for complete search history.

(56) References Cited

U.S. PATENT DOCUMENTS

2018/0369926 A1* 12/2018 Kodama ............... B23B 27/148
2019/0039148 A1   2/2019 Kubo et al.

FOREIGN PATENT DOCUMENTS

| JP | 2007-229821 A | 9/2007 |
| JP | 2009-166216 A | 7/2009 |
| JP | 5303732 B2 | 10/2013 |
| KR | 10-2010-0135641 A | 12/2010 |
| KR | 20150004339 A | 1/2015 |
| WO | 2013/081047 A1 | 6/2013 |
| WO | 2017/090765 A1 | 1/2017 |
| WO | 2017/146200 A1 | 8/2017 |

* cited by examiner

COATED TOOL AND CUTTING TOOL INCLUDING SAME

TECHNICAL FIELD

The present disclosure relates to a coated tool including a coating layer on a surface of a base member and a cutting tool including the coated tool.

BACKGROUND

A coated tool such as a cutting tool has been known in which a coating layer formed by laminating an $Al_2O_3$ layer is formed on a surface of a base member such as a cemented carbide, a cermet or a ceramic through a bonding film.

With the recent increase in the efficiency of a cutting process, cutting tools are increasingly used in heavy intermittent cutting where large impacts are applied to the cutting edge. Under such severe cutting conditions, a large impact is applied to the coating layer, and chipping or peeling of the coating layer tends to occur. Therefore, improvement of fracture resistance is required for the coating layer in addition to wear resistance.

As a technique for improving the fracture resistance in the cutting tool, Patent Document 1 discloses a technique in which a bonding film and an $Al_2O_3$ layer are formed sequentially, and a dendrite extending toward the $Al_2O_3$ layer side and a branched protrusion extending from the dendrite are provided on the bonding film, thereby enhancing the adhesion between the bonding film and the $Al_2O_3$ layer and preventing the peeling of the coating layer. Patent Document 1 discloses that the dendrite is Ti (CO) or Ti (CNO) and that the branched protrusion is (TiAl) (CNO). Patent Document 1 describes that after the formation of the dendrite, the flow of a source gas is stopped once, and while the temperature is maintained, the pressure and the type of the source gas are changed to form the dendrite having a composition different from that of the dendrite.

RELATED ART DOCUMENTS

Patent Document

Patent Document 1: Japanese Patent No. 5303732

SUMMARY

A coated tool of the present disclosure is provided with a base member and a coating layer located on a surface of the base member. The coating layer includes a TiCNO layer and an $Al_2O_3$ layer. The $Al_2O_3$ layer is located in contact with the TiCNO layer at a position farther from the base member than the TiCNO layer is. The TiCNO layer includes a plurality of first protrusions that project toward the $Al_2O_3$ layer, and a beam that extends in a direction intersecting a direction in which the first protrusions project, to connect the first protrusions. A cutting tool of the present disclosure is provided with: a holder extending from a first end toward a second end and including a pocket on a side of the first end; and the above-described coated tool located in the pocket.

EMBODIMENTS

<Coated Tool>

Figure 1:
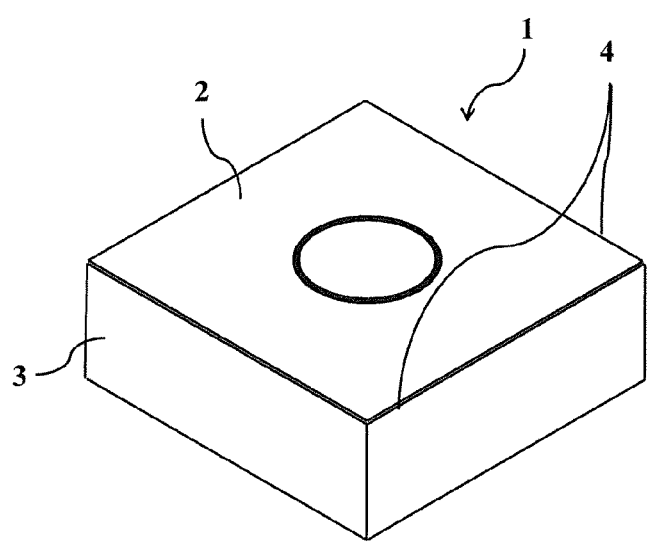
FIG. 1 is a schematic perspective view illustrating an example of a coated tool of the present disclosure.

In the example illustrated in FIG. 1, the coated tool of the present disclosure includes a main surface in a substantially rectangular plate-like shape. However, the main surface is not limited to this shape. A coated tool 1 includes a first surface 2 and a second surface 3 and includes a cutting edge 4 on at least a part of a portion where the first surface 2 and the second surface 3 intersect. The first surface 2 is a surface called a rake surface, and the second surface 3 is a surface called a flank surface. Hence it can also be said that the cutting edge 4 is provided on at least a part of a portion where the rake surface 2 and the flank surface 3 intersect.

Figure 2:
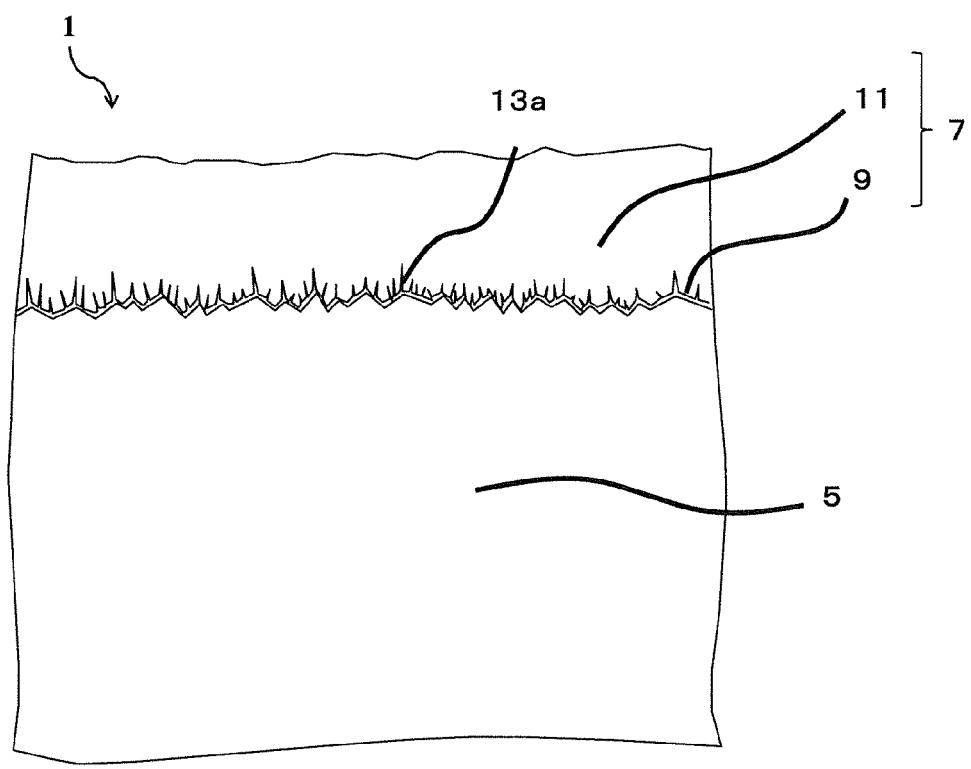
FIG. 2 is a schematic view for explaining a configuration of a cross-section of a coating layer in the coated tool of FIG. 1.

As illustrated in a schematic view for explaining a configuration of a cross-section of a coating layer 7 in the coated tool 1 illustrated in FIG. 2, the coated tool 1 includes a base member 5 and a coating layer 7 located on a surface of the base member 5.

A material constituting the base member 5 of the coated tool 1 may be a hard alloy, a ceramic or a metal. The hard alloy may be a cemented carbide including tungsten carbide (WC) and an iron-group metal such as cobalt (Co) or nickel (Ni). Another hard alloy may be a Ti-based cermet including titanium carbonitride (TiCN) and iron-group metals such as cobalt (Co) or nickel (Ni). The ceramic may be $Si_3N_4$, $Al_2O_3$, diamond or cubic boron nitride (cBN). The metal may be carbon steel, high-speed steel or alloy steel. If used as the coated tool 1, the base member 5 is favorably made of the cemented carbide or cermet among the materials described above in terms of fracture resistance and wear resistance.

The coating layer 7 includes a TiCNO layer 9 and an $Al_2O_3$ layer 11. The $Al_2O_3$ layer 11 is in contact with the TiCNO layer 9 at a position of the TiCNO layer 9 far from the base member 5.

Figure 3:
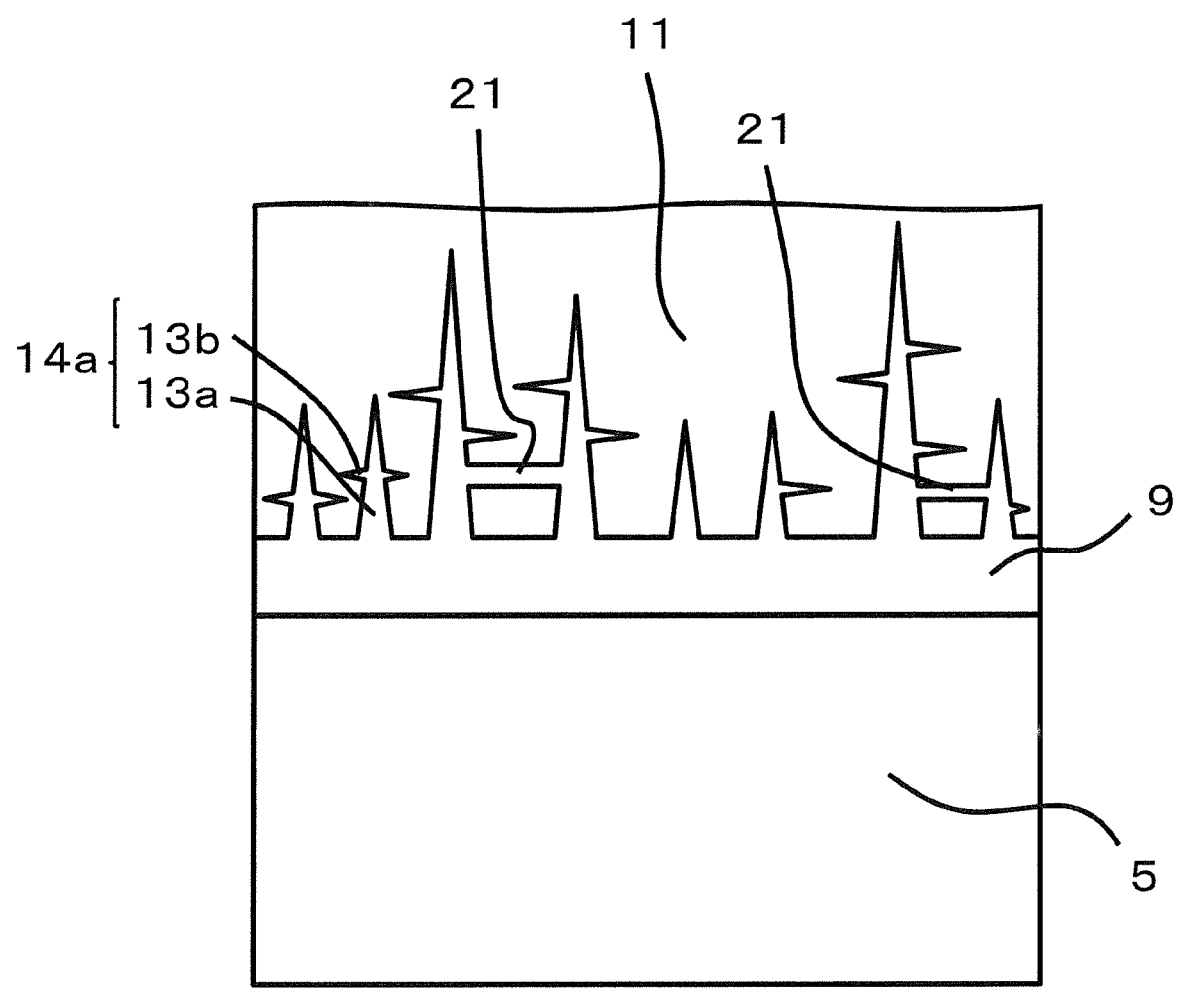
FIG. 3 is an enlarged view of a main part of the coated tool of the present disclosure for explaining a configuration in the vicinity of the TiCNO layer and the $Al_2O_3$ layer.

As illustrated in FIG. 3, the coated tool 1 of the present disclosure includes a plurality of first protrusions 13a projecting toward the $Al_2O_3$ layer 11. Further, the coated tool 1 includes a beam 21 that extends in a direction intersecting a direction in which the first protrusions 13a project, to connect the first protrusions 13a to each other.

With the beam 21 provided connecting the first protrusions 13a to each other, the first protrusions 13a support each other and are unlikely to be broken. Both ends of the beam 21 are supported by the first protrusions 13a, so that the adhesion strength with the $Al_2O_3$ layer 11 is high.

Figure 4:
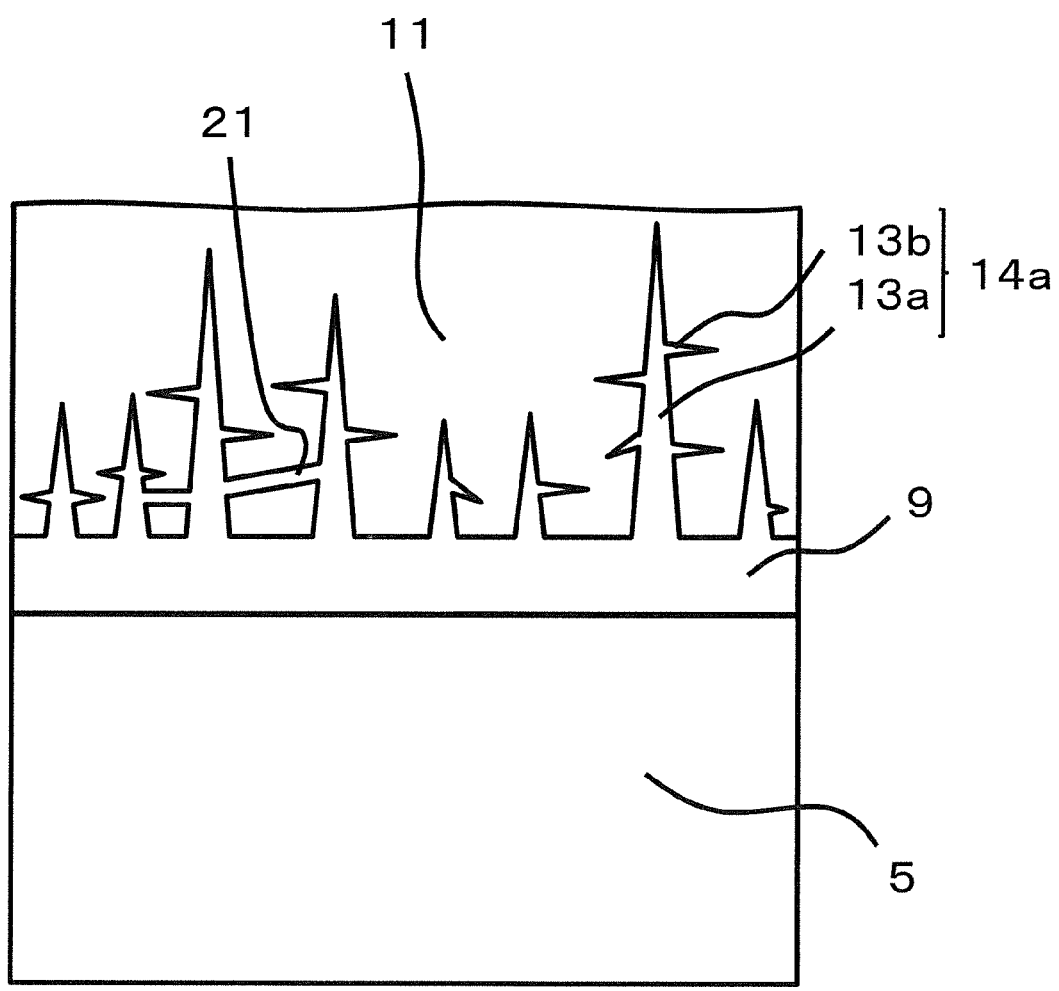
FIG. 4 is an enlarged view of the main part of the coated tool of the present disclosure for explaining the configuration in the vicinity of the TiCNO layer and the $Al_2O_3$ layer.

As illustrated in FIG. 4, the first protrusions 13a may be connected by a plurality of beams 21. With such a configuration, the adhesion strength with the $Al_2O_3$ layer 11 further increases. The extending direction of the beam 21 may be inclined relative to a facing surface of the base member 5 facing the coating layer 7. With such a configuration, the contact area between the beam 21 and the $Al_2O_3$ layer 11 increases, and the adhesion strength with the $Al_2O_3$ layer 11 increases as compared with a case where the beam is disposed in parallel.

The coated tool 1 of the present disclosure may also include a second protrusion 13b projecting from the first protrusion 13a in a direction intersecting the direction in which the first protrusion 13a projects. Hereinafter, a composite of the first protrusion 13a and the second protrusion 13b is also referred to as a first composite protrusion 14a.

Figure 5:
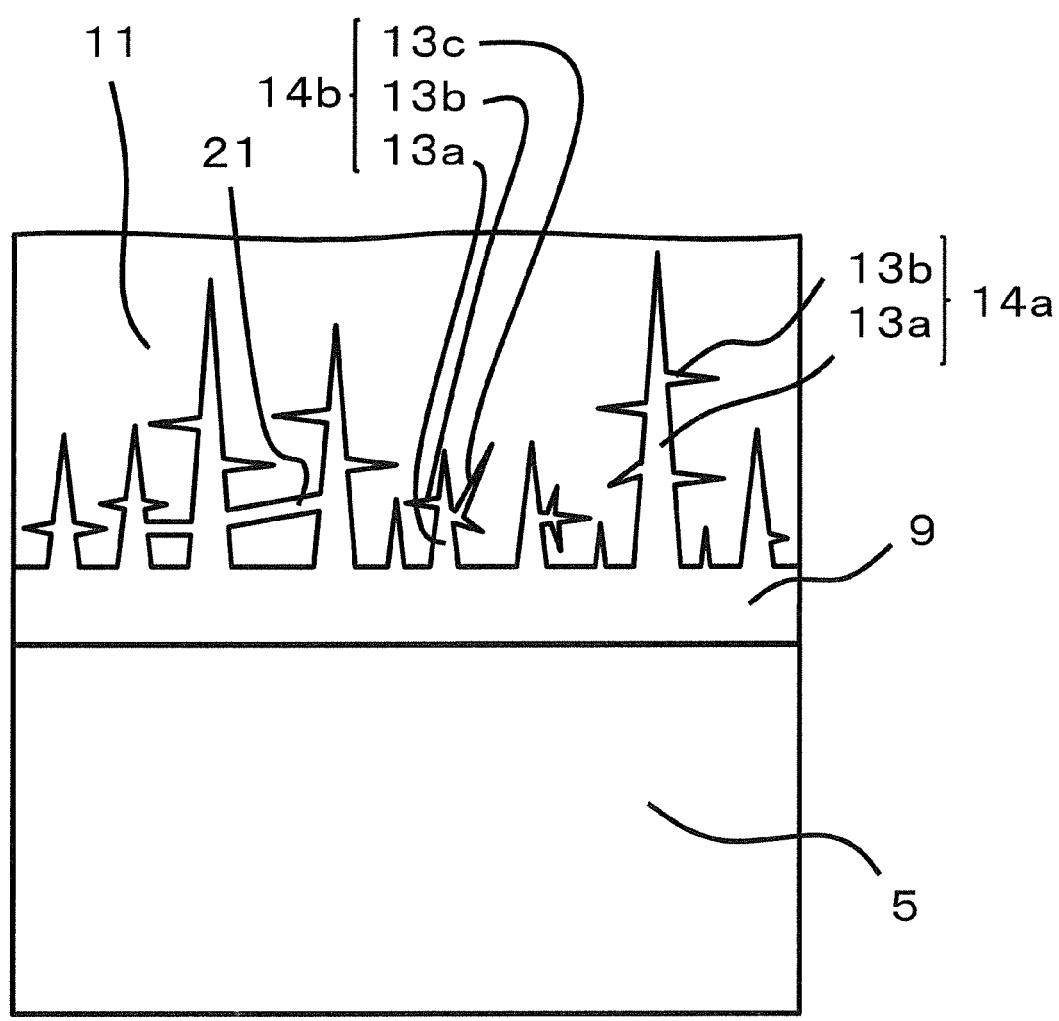
FIG. 5 is an enlarged view of the main part of the coated tool of the present disclosure for explaining the configuration in the vicinity of the TiCNO layer and the $Al_2O_3$ layer.

As illustrated in FIG. 5, the coated tool 1 of the present disclosure may include a third protrusion 13c projecting from the second protrusion 13b in a direction intersecting the direction in which the second protrusion 13b projects. Hereinafter, a composite of the first protrusion 13a, the second protrusion 13b, and the third protrusion 13c is also referred to as a second composite protrusion 14b.

The beam 21 may be connected to the first composite protrusion 14a. The beam 21 may be connected to the second composite protrusion 14b.

If the first composite protrusion 14a and the second composite protrusion 14b are provided, the adhesion force between the TiCNO layer 9 and the $Al_2O_3$ layer 11 is large.

The ratio of the number of second composite protrusions 14b to the sum of the number of first composite protrusions 14a and the number of second composite protrusions 14b may be 20% or more in the cross-section orthogonal to the surface of the base member 5.

If the proportion of the second composite protrusion 14b among the composite protrusions increases, the adhesion force between the TiCNO layer 9 and the $Al_2O_3$ layer 11 becomes larger.

In the coated tool 1 of the present disclosure, in addition to the beam 21, the first protrusion 13a may project toward the $Al_2O_3$ layer 11, and the second protrusion 13b may project from the first protrusion 13a in the direction intersecting the direction in which the first protrusion 13a projects.

With such a configuration, in addition to the beam 21, the second protrusion 13b increases the adhesion strength between the TiCNO layer 9 and the $Al_2O_3$ layer 11.

Further, the third protrusion 13c may project from the second protrusion 13b in the direction intersecting the direction in which the second protrusion 13b projects. With such a configuration, in addition to the beam 21, the third protrusion 13c increases the adhesion strength between the TiCNO layer 9 and the $Al_2O_3$ layer 11.

As described above, in the coated tool 1 of the present disclosure, the TiCNO layer 9 and the $Al_2O_3$ layer 11 are less likely to peel off due to the engagement of the beam 21, the first protrusion 13a, the second protrusion 13b, and the third protrusion 13c with the $Al_2O_3$ layer 11. In FIG. 2, the beam 21, the second protrusion 13b and the third protrusion 13c are omitted, otherwise the figure would be complicated.

The beam 21, the first protrusion 13a, the second protrusion 13b, and the third protrusion 13c in the coated tool 1 of the present disclosure may all include Ti, C, N and O, and have homogeneous compositions. With these having homogeneous compositions, the first protrusion 13a and the second protrusion 13b are less likely to be cracked or broken, and the adhesion between the TiCNO layer 9 and the $Al_2O_3$ layer 11 is improved as compared with a case where the first protrusion 13a and the second protrusion 13b have different compositions.

That the beam 21, the first protrusion 13a, the second protrusion 13b, and the third protrusion 13c have the homogeneous compositions means that the difference among the respective constituents is 5% or less.

In addition, the deviation among each composition may be 3% or less. The deviation may be 1% or less.

Such a configuration can be obtained by using the same gas during the formation of the beam 21, the first protrusion 13a, the second protrusion 13b, and the third protrusion 13c.

In addition, the TiCNO layer 9 may include a plurality of second protrusions 13b on the first protrusions 13a, thereby making the TiCNO layer 9 and the $Al_2O_3$ layer 11 even less likely to peel off.

As illustrated in FIG. 4, the second protrusion 13b may project in a direction toward the base member 5. That the second protrusion 13b projects in the direction toward the base member 5 means a state where an axis of the second protrusion 13b intersects the base member 5 when being extended, the axis connecting the apex of the second protrusion 13b and the midpoint of the width of a portion that is the origin of the projection of the second protrusion 13b in the cross-section as illustrated in FIG. 4.

In each of the cross-sections as illustrated in FIGS. 3 to 5, the width of a portion of the first protrusion 13a, the portion being the origin of the projection from the TiCNO layer 9, may be larger than the width of the portion of the second protrusion 13b projecting from the first protrusion 13a, the portion being the origin of the projection from the first protrusion 13a. The length of the first protrusion 13a may be larger than the length of the second protrusion 13b projecting from the first protrusion 13a. Note that the length of the first protrusion 13a means a distance between the apex of the first protrusion 13a and the midpoint of the width of the portion that is the origin of the projection of the first protrusion 13a. Similarly, the length of the second protrusion 13b means a distance between the apex of the second protrusion 13b and the midpoint of the width of the portion that is the origin of the projection of the second protrusion 13b.

In the cross-section orthogonal to the surface of the base member 5, the average width of the bases of the first protrusions 13a may be 40 to 200 nm. The average length of the first protrusions 13a may be 10 to 500 nm. Further, the average length of the first protrusions 13a *may be* 50 to 300 nm.

The width of the base of the first protrusion 13a is the width of the portion that is the origin of the projection of the first protrusion 13a. The average value of the widths of the bases of the first protrusions 13a is the average value of widths of bases of 20 or more first protrusions 13a. The length of the first protrusion 13a means the distance between the apex of the first protrusion 13a and the midpoint of the width of the portion that is the origin of the projection of the first protrusion 13a. The average length of the first protrusions 13a is the average value of lengths of 20 or more first protrusions 13a. Similarly, the length of the second protrusion 13b means a distance between the apex of the second protrusion 13b and the midpoint of the width of the portion that is the origin of the projection of the second protrusion 13b.

The average width of the bases of the first protrusions 13a may be 60 to 120 nm. The average length of the first protrusions 13a may be 150 to 230 nm. If the first protrusion 13a has such a shape, the difference between the longest first protrusion 13a and the shortest first protrusion 13a becomes small. If the first protrusion parts 13a are relatively uniform as described above, the TiCNO layer 9 and the $Al_2O_3$ layer 11 are even less likely to peel off.

The average length of the first protrusions 13a may be four times or less the average width of the bases of the first protrusions 13a. With such a structure, the first protrusion 13a is less likely to be broken, so that the TiCNO layer 9 and the $Al_2O_3$ layer 11 are even less likely to peel off. The average length of the first protrusions 13a may be three times or less the average width of the bases of the first protrusions 13a. As the ratio becomes smaller, the first protrusion 13a is less likely to be broken, so that the TiCNO layer 9 and the $Al_2O_3$ layer 11 are even less likely to peel off. In particular, the average length of the first protrusions 13a may be 2.5 times or less the average width of the bases of the first protrusions 13a.

The length of the beam 21 may be 10 to 500 nm. The maximum width of the beam 21 may be 100 nm or less.

The length of the second protrusion 13b may be 10 to 150 nm. The maximum width of the second protrusion 13b may be 50 nm or less. The length of the third protrusion 13c may be 10 to 70 nm. The maximum width of the third protrusion 13c may be 20 nm or less.

The length of the third protrusion 13c may be shorter than the length of the second protrusion 13b. With such a structure, the first protrusion 13a and the second protrusion 13b are less likely to be broken, and the TiCNO layer 9 and the $Al_2O_3$ layer 11 are less likely to peel off. As a result, the fracture resistance of the coated tool 1 is improved.

The length of the third protrusion 13c may be larger than the length of the second protrusion 13b. With such a structure, even if the number of second composites is small, the TiCNO layer 9 and the $Al_2O_3$ layer 11 are less likely to peel off.

The first protrusion 13a may not be formed perpendicularly to the first surface 2 of the base member 5 but may be inclined relative to the first surface 2 of the base member 5.

If the thickness of the TiCNO layer 9 is in the range of 10 nm to 35 nm, the hardness of the TiCNO layer 9 does not decrease, and the $Al_2O_3$ layer 11 has an α-crystal structure. Here, the thickness of the TiCNO layer 9 excludes the first protrusion 13a, the second protrusions 13b, and the third protrusions 13c.

The TiCNO layer 9 may include, for example, 30 to 70% by atom of titanium, 1 to 70% by atom of carbon, 1 to 35% by atom of nitrogen, and 3 to 20% by atom of oxygen. Further, the TiCNO layer 9 may include 10% by atom or less of aluminum. The TiCNO layer 9 may include 1 to 10% by atom of a component such as chlorine or chromium. The TiCNO layer 9 may include other minor components.

In the coated tool 1 of the present disclosure, the TiCNO layer and the first protrusion 13a, the second protrusion 13b, and the third protrusion 13c may all have the same composition and may be within the composition range described above.

The TiCNO layer 9 including the first protrusions 13a can be formed on the surface of the base member 5 by chemical vapor deposition (CVD) method under the following conditions.

The base member 5 may be placed in a chamber of a film formation apparatus, and the TiCNO layer 9 may be formed by, for example, making the following settings: a film formation temperature is 900° C. to 990° C., gas pressure is 5 kPa to 40 kPa, and a reactive gas composition is 3% by volume to 15% by volume of titanium tetrachloride ($TiCl_4$) gas, 3% by volume to 10% by volume of methane ($CH_4$) gas, 3% by volume to 50% by volume of nitrogen ($N_2$) gas, 0.5% by volume to 2.0% by volume of carbon monoxide (CO) gas, and the rest being hydrogen ($H_2$) gas. If the nitrogen ($N_2$) gas in the reactive gas composition is set to 30% by volume to 50% by volume, the average width of the bases of the first protrusions 13a tends to be wide and the average length of the first protrusions 13a tends to be short. In other words, under such a condition, it is easy to obtain the first protrusion 13a that is thick, short, and less likely to be broken.

In the later stage of the film formation of the TiCNO layer 9, the beam 21 is formed by lowering the film formation temperature to set the film formation temperature in the range of 900 to 940° C. and setting the film formation time in the range of 900 to 940° C. to 90 minutes or longer, without changing the mixture of the source gas.

In the later stage of the formation of the TiCNO layer 9, that is, in the step of forming the beam 21, if the film formation time is extended, the number of second protrusions 13b increases, and the widths and lengths thereof tend to increase. The second protrusion 13b, with its projecting direction extending toward the base member 5, is easily formed. In other words, the first composite protrusion 14a is easily formed. If the film formation time is further extended, the third protrusion 13c projecting from the second protrusion 13b is easily formed. In other words, the second composite protrusion 14b is easily formed.

After the formation of the TiCNO layer 9, the $Al_2O_3$ layer 11 can be formed by making the following settings: the film formation temperature is 900° C. to 990° C., the gas pressure is 5 kPa to 20 kPa, and the composition of the reactive gas is 5% by volume to 15% by volume of aluminum trichloride ($AlCl_3$) gas, 0.5% by volume to 2.5% by volume of hydrogen chloride (HCl) gas, 0.5% by volume to 5.0% by volume of carbon dioxide ($CO_2$) gas, 0% by volume to 1.0% by volume of hydrogen sulfide ($H_2S$) gas, and the rest being a hydrogen ($H_2$) gas. The $Al_2O_3$ layer 11 may be made of α-alumina.

Figure 6:
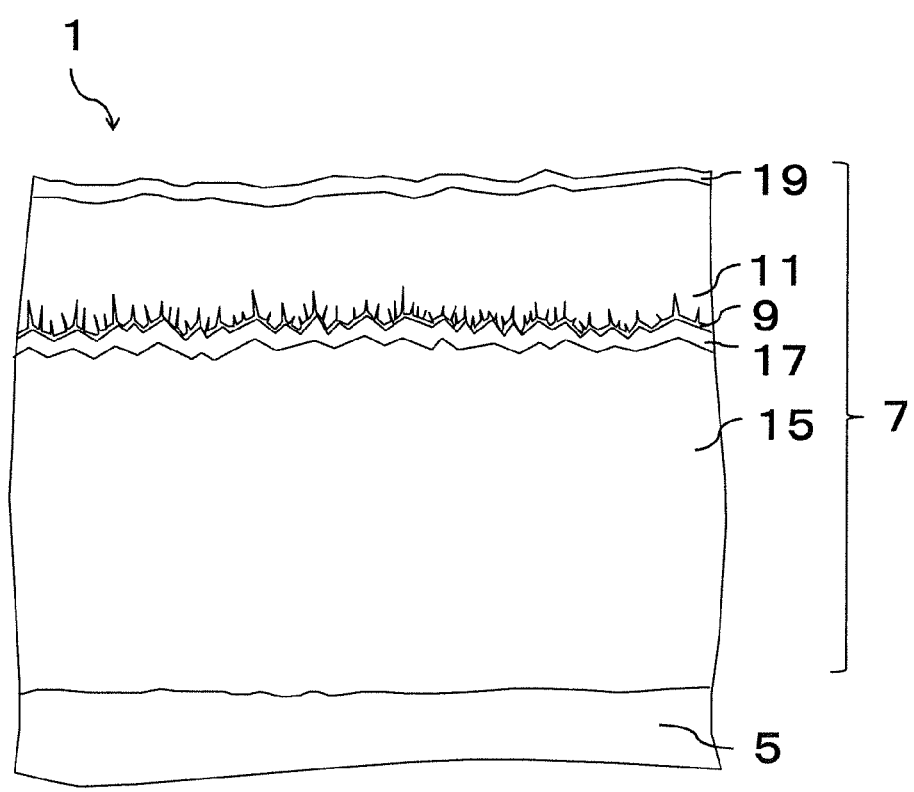
FIG. 6 is a schematic view for explaining a configuration of a cross-section of another form of the coating layer in the coated tool of the present disclosure.

An example in which the TiCNO layer 9 and the $Al_2O_3$ layer 11 are sequentially formed on the base member 5 has been described. As illustrated in FIG. 6, the coating layer 7 may include a first TiCN layer 15 and a second TiCN layer 17 sequentially from the base member 5. The TiCNO layer 9 and the $Al_2O_3$ layer 11 may be sequentially provided on the second TiCN layer 17. In addition, a surface layer 19 including Ti and N may further be provided on the $Al_2O_3$ layer 11. In FIG. 6, the beam 21, the second protrusion 13b, and the third protrusion 13c are omitted.

The surface layer 19 may be made of other materials except for titanium nitride, such as titanium carbonitride, titanium oxycarbonitride, or chromium nitride. The surface layer 19 may be made of a colored material and have a function of easily discriminating whether or not the cutting edge 4 has been used. The surface layer 19 may be provided with a thickness of 0.1 μm to 3.0 μm. In addition, a base layer (not illustrated) made of TiN may further be provided between the base member 5 and the first TiCN layer 15.

If the base member 5 includes components such as Co, carbon (C), or tungsten (W), the base layer has a function of preventing the diffusion of these components into the layer present on the base layer. For example, if the first TiCN layer 15 is present on the base layer, the diffusion of the above components into the first TiCN layer 15 is prevented, and the lowering of the hardness of the first TiCN layer 15 is prevented. Alternatively, the carbon component in the base member 5 may be diffused into TiN of the base layer to form TiCN. The thickness of the base layer may be set to 0.1 µm to 1.0 µm.

If the coated tool 1 of the present disclosure includes a first TiCN layer 15, the thickness of the first TiCN layer 15 may be set to 2 µm to 15 µm. The thickness of the second TiCN layer 17 may be set to 10 nm to 900 nm.

The first TiCN layer 15 is made of a so-called moderate temperature (MT)-TiCN layer. If the thickness of the first TiCN layer 15 is 2 µm to 15 µm, which is formed by forming the MT-TiCN layer using a raw material that includes titanium tetrachloride ($TiCl_4$) gas, nitrogen ($N_2$) gas, acetonitrile ($CH_3CN$) gas, or the like at a relatively low film formation temperature of 780° C. to 880° C., the first TiCN layer 15 has high wear resistance and fracture resistance.

The first titanium carbonitride crystal included in the first TiCN layer 15 may be a columnar crystal elongated in the thickness direction of the coating layer 7.

The second TiCN layer 12 is made of a so-called high temperature (HT)-TiCN layer. The HT-TiCN layer may be formed using titanium tetrachloride ($TiCl_4$) gas, nitrogen ($N_2$) gas, methane ($CH_4$) gas, or the like as a source gas and not including acetonitrile ($CH_3CN$) gas at a film formation temperature in the range of 900° C. to 1050° C. The film may be formed at a higher temperature than the first TiCN layer 15. The thickness of the second TiCN layer 17 may be from 10 nm to 900 nm.

Here, an interface layer (not illustrated) may be disposed between the first TiCN layer 15 and the second TiCN layer 17, the interface layer including 30 to 70% by atom of titanium, 15 to 35% by atom of carbon, 15 to 35% by atom of nitrogen, and 2 to 10% by atom of oxygen. The thickness of the interface layer may be from 5 nm to 50 nm.

Instead of forming the interface layer, a method may be used in which after the formation of the first TiCN layer 15, the film formation chamber is temporarily cooled, a sample is removed into the atmosphere, and then the sample is placed again in the film formation chamber to heat the film formation chamber, thereby forming the second TiCN layer 17.

The carbon content ratio to the total content of carbon and nitrogen included in the second TiCN layer 17 may be smaller than the carbon content ratio of the first TiCN layer 15. This leads to improvement in the hardness of the first TiCN layer 15. As a result, the wear resistance and the fracture resistance of the coating layer 7 are improved. Here, the carbon content ratio is the ratio (C/(C+N)) of the content of carbon to the total content of carbon (C) and nitrogen (N) included.

If the carbon content ratio of the first TiCN layer 15 is set to 0.52 to 0.57 and the carbon content ratio of the second TiCN layer 17 is set to 0.42 to 0.51, the wear resistance and the fracture resistance of the coating layer 7 are further improved. If the carbon content in the first TiCN layer 15 is set to 15 to 29% by atom and the nitrogen content is set to 22 to 35% by atom, the wear resistance and the fracture resistance of the coating layer 7 are further enhanced. If the carbon content of the second TiCN layer 17 is set to 13 to 24% by atom and the nitrogen content is set to 23 to 35% by atom, the adhesion between the second TiCN layer 17 and the $Al_2O_3$ layer 11 is enhanced.

If the first TiCN layer 15 includes 45 to 60% by atom of titanium, 15 to 29% by atom of carbon, and 22 to 35% by atom of nitrogen, the wear resistance and the fracture resistance of the coating layer 7 are higher. The first TiCN layer 15 may include 0.5% or less by atom of oxygen. If the second TiCN layer 17 includes 48 to 60% by atom of titanium, 10 to 20% by atom of carbon, and 15 to 25% by atom of nitrogen, the second TiCN layer 17 is not broken, and the adhesion between the second TiCN layer 17 and the $Al_2O_3$ layer 11 is high. The second TiCN layer 17 may include 1 to 10% by atom of oxygen.

That is, oxygen may be present in the first TiCN layer 15 and the second TiCN layer 17, and the oxygen present in the second TiCN layer 17 may be more than the oxygen present in the first TiCN layer 15.

Note that the carbon content and the nitrogen content in each of the first TiCN layer 15 and the second TiCN layer 17 are measured using an energy dispersive X-ray spectrometer (EDS) accompanying a transmission electron microscope (TEM).

The structure and thickness of each layer and the shape of a crystal constituting each layer are measurable by observing an electron microscope photograph (scanning electron microscope (SEM) photograph or transmission electron microscope (TEM) photograph) in a cross-section of the tool 1.

Further, the coated tool 1 is designed to perform a cutting process by bringing the cutting edge, formed at an intersection between the rake surface and the flank surface, into contact with a workpiece and can produce the excellent effects described above. In addition to the cutting tool of the present disclosure, the coated tool 1 of the present disclosure can be applied to various uses such as wear-resistant parts like sliding parts and molds, excavation tools, tools like edge tools, and impact-resistant parts, and in these cases as well, the coated tool 1 has excellent mechanical reliability.

Next, an example of a method for manufacturing the tool of the present disclosure will be described.

Firstly, metal powder, carbon powder, or the like is suitably added to inorganic powder of carbide, nitride, carbonitride, oxide, or the like, which can form a hard alloy constituting the base member by sintering, and these are mixed together, to prepare a mixed powder. Then, the mixed powder is used to be molded into a predetermined tool shape by a known molding method such as press-molding, casting molding, extrusion molding and cold isostatic pressing. The molded body is sintered in a vacuum or a non-oxidizing atmosphere to produce the base member described above. The surface of the base member is then subjected to a polishing process, and a cutting part is subjected to a honing process if desired.

Subsequently, a coating layer is deposited on the surface by chemical vapor deposition (CVD) method.

Firstly, a base member is placed in the chamber, and a TiN layer as a base layer is formed. The layer is formed by making the following settings: the film formation temperature is 800° C. to 940° C., the gas pressure is 8 kPa to 50 kPa, and the composition of the reactive gas is 0.5% by volume to 10% by volume of titanium tetrachloride ($TiCl_4$) gas, 10% by volume to 60% by volume of nitrogen ($N_2$) gas, and the rest being hydrogen ($H_2$) gas.

Next, a first TiCN layer is formed. The layer is formed by making the following settings: the film formation temperature is 780° C. to 880° C., the gas pressure is 5 kPa to 25 kPa, and the composition of the reactive gas is 0.5% by volume to 10% by volume of titanium tetrachloride ($TiCl_4$) gas, 5% by volume to 60% by volume of nitrogen ($N_2$) gas, 0.1% by volume to 3.0% by volume of acetonitrile ($CH_3CN$) gas, and the rest being hydrogen ($H_2$) gas. At this time, a mean crystal width of columnar crystals of titanium carbonitride constituting the first TiCN layer can be made larger on the side of the surface than on the side of the base member by increasing the content ratio of the acetonitrile ($CH_3CN$) gas in a later stage of the film formation than in an initial stage of the film formation.

Then, an interface layer is formed on the first TiCN layer. The layer is formed by making the following settings: the film formation temperature is 900° C. to 1050° C., the gas pressure is 5 kPa to 40 kPa, and the composition of the reactive gas is 3% by volume to 30% by volume of titanium tetrachloride ($TiCl_4$) gas, 3% by volume to 15% by volume of methane ($CH_4$) gas, 5% by volume to 10% by volume of nitrogen ($N_2$) gas, 0.5% by volume to 10% by volume of carbon dioxide ($CO_2$) gas, and the rest being hydrogen ($H_2$) gas.

Next, a second TiCN layer is formed. The layer is formed by making the following settings: the film formation temperature is 900° C. to 990° C., the gas pressure is 5 kPa to 40 kPa, and the composition of the reactive gas is 1% by volume to 4% by volume of titanium tetrachloride ($TiCl_4$) gas, 5% by volume to 20% by volume of nitrogen ($N_2$) gas, 0.1% by volume to 10% by volume of methane ($CH_4$) gas, and the rest being hydrogen ($H_2$) gas.

Subsequently, a TiCNO layer 9 is formed. Firstly, the layer is formed by making the following settings: the film formation temperature is 940° C. to 990° C., the gas pressure is 5 kPa to 40 kPa, and the composition of the reactive gas is 3% by volume to 15% by volume of titanium tetrachloride ($TiCl_4$) gas, 3% by volume to 10% by volume of methane ($CH_4$) gas, 3% by volume to 50% by volume of nitrogen ($N_2$) gas, 0.5% by volume to 2.0% by volume of carbon oxide (CO) gas, and the rest being hydrogen ($H_2$) gas. Next, the film formation temperature is lowered to 900 to 940° C., and the layer is formed such that the film formation time in the range of 900 to 940° C. is 90 minutes or longer. Then, an $Al_2O_3$ layer is formed. The $Al_2O_3$ layer is formed by making the following settings: the film formation temperature is 950° C. to 1100° C., the gas pressure is 5 kPa to 20 kPa, and the composition of the reactive gas is 5% by volume to 15% by volume of aluminum trichloride ($AlCl_3$) gas, 0.5% by volume to 2.5% by volume of hydrogen chloride (HCl) gas, 0.5% by volume to 5.0% by volume of carbon dioxide ($CO_2$) gas, 0% by volume to 1.0% by volume of hydrogen sulfide ($H_2S$) gas, and the rest being hydrogen ($H_2$) gas.

Then, a TiN layer which is a surface layer is formed. The layer is formed by making the following settings: the film formation temperature is 960° C. to 1100° C., the gas pressure is 10 kPa to 85 kPa, and the reactive gas composition is 0.1% by volume to 10% by volume of titanium tetrachloride ($TiCl_4$) gas, 10% by volume to 60% by volume of nitrogen ($N_2$) gas, and the rest being hydrogen ($H_2$) gas.

Thereafter, the polishing process is performed on at least a cutting part of the surface of the formed coating layer if desired. By the polishing process, the cutting part is smoothly processed to prevent the welding of the workpiece, and a tool with more excellent fracture resistance is obtained.

In the above example, the example has been shown where the first TiCN layer, the second TiCN layer, and the surface layer are provided, but the TiCNO layer and the $Al_2O_3$ layer may be directly laminated on the surface of the base member.

Although the coated tool 1 of the present disclosure has been described above, the present disclosure is not limited to the embodiment described above, and various improvements and modifications may be made within a range not departing from the gist of the present disclosure.

<Cutting Tool>

Next, the cutting tool of the present disclosure will be described with reference to the drawings.

Figure 7:
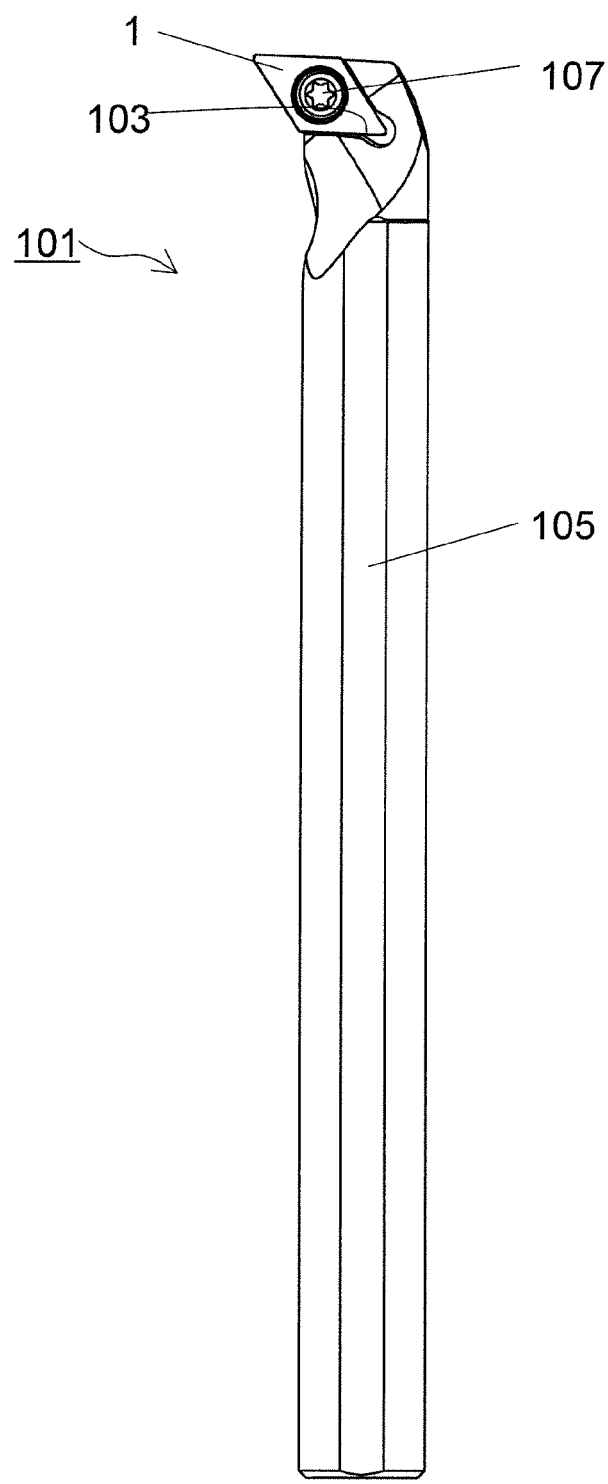
FIG. 7 is a plan view illustrating an example of the cutting tool of the present disclosure.

As illustrated in FIG. 7, a cutting tool 101 of the present disclosure is, for example, a rod-shaped body extending from a first end (upper end in FIG. 7) toward a second end (lower end in FIG. 7). As illustrated in FIG. 7, the cutting tool 101 includes a holder 105 including a pocket 103 on a first end side (tip side), and the coated tool 1 located in the pocket 103. Because including the coated tool 1, the cutting tool 101 can perform a stable cutting process over a long period of time.

The pocket 103 is a part that permits attachment of the coated tool 1. The pocket 103 includes a seating surface parallel to a lower surface of the holder 105, and a constraining side surface inclined relative to the seating surface. The pocket 103 opens into a side of the first end of the holder 105.

The coated tool 1 is located in the pocket 103. At this time, the lower surface of the coated tool 1 may be in direct contact with the pocket 103, or a sheet (not illustrated) may be disposed between the coated tool 1 and the pocket 103.

The coated tool 1 is mounted on the holder 105 such that at least a part of a portion used as a cutting edge 4 at a ridge line where the first surface 3 and the second surface 5 intersect projects outward from the holder 105. In the present embodiment, the coated tool 1 is attached to the holder 105 with a fixing screw 107. That is, the coated tool 1 is attached to the holder 105 by inserting the fixing screw 107 into a through hole 17 of the coated tool 1, inserting the tip of the fixing screw 107 into a screw hole (not illustrated) formed in the pocket 103, and screwing the screw parts together.

As the material of the holder 105, steel, cast iron or the like can be used. Among these members, steel having high toughness may be used.

In the present embodiment, a cutting tool 101 used for a so-called turning process is exemplified. Examples of the turning process include an inner-diameter process, an outer-diameter process, and grooving process. Note that the cutting tool 101 is not limited to a tool used for the turning process. For example, the coated tools 1 of the above embodiment are applicable to the cutting tools for use in the milling process.

EXAMPLES

Firstly, an amount of 6% by mass of metal cobalt powder having a mean particle diameter of 1.2 μm, an amount of 0.5% by mass of titanium carbide powder having a mean particle diameter of 2.0 μm, an amount of 5% by mass of niobium carbide powder having a mean particle diameter of 2.0 μm, and the rest, namely, tungsten carbide powder having a mean particle diameter of 1.5 μm were added and mixed together. This was molded into a tool shape (CNMG120408) by press molding, followed by a debindering process. This was then sintered in vacuum at 1500° C. and 0.01 Pa for one hour, thereby manufacturing a base member composed of cemented carbide. The manufactured base member was then subjected to a brushing process, and a part of the base member which served as a cutting edge was subjected to round honing.

Next, the coating layer was formed on the above base member of cemented carbide by combining individual film formation conditions shown in Table 1 by chemical vapor deposition (CVD) method as described in Tables 2 and 3, thereby manufacturing a coated tool. In Table 1, each compound is represented by a chemical symbol.

The cross-section including the coating layer of the sample was subjected to SEM observation to observe the presence or absence of the first protrusion, the second protrusion, the third protrusion and the beam and observe the forms of the first protrusion, the second protrusion, the third protrusion and the beam. The ratio of the number of first composite protrusions to the sum of the number of first composite protrusions and the number of second composite protrusions and the ratio of the number of second composite protrusions were examined. Then, an intermittent cutting test was conducted using the obtained coated tool under the following conditions to evaluate the fracture resistance. Tables 2 and 3 show the test results.

<Intermittent Cutting Condition>

Workpiece: chromium molybdenum steel with four flutes (SCM440)

Tool Shape: CNMG120408

Cutting speed: 300 m/min

Feed speed: 0.3 mm/rev

Depth of Cut: 1.5 mm

Others: Using water-soluble cutting fluid

Evaluation item: The number of impacts before reaching peeling of $Al_2O_3$ layer was measured.

TABLE 1

| Condition | Mixed gas composition (% by volume) | Chamber temperature (° C.) | Pressure (kPa) | Time (min) |
|---|---|---|---|---|
| TiN | $TiCl_4$: 1.0, $N_2$: 38, $H_2$: balance | 850 | 16 | 180 |
| TiCN-1 | $TiCl_4$: 4.0, $N_2$: 23, $CH_3CN$: 0.4, $H_2$: balance | 850 | 90 | 400 |
| TiCN-2 | $TiCl_4$: 4.0, $N_2$: 20, $CH_4$: 8.0, $H_2$: balance | 950 | 13 | 80 |
| TiCNO-01 | $TiCl_4$: 4.0, $N_2$: 20, $CH_4$: 8.0, CO: 1.4, $H_2$: balance | 970 | 10 | 60 |
| TiCNO-02 | $TiCl_4$: 4.0, $N_2$: 20, $CH_4$: 8.0, CO: 1.4, $H_2$: balance | 970 | 10 | 30 |
| TiCNO-03 | $TiCl_4$: 4.0, $N_2$: 40, $CH_4$: 8.0, CO: 1.4, $H_2$: balance | 970 | 10 | 30 |
| TiCNO-1 | $TiCl_4$: 4.0, $N_2$: 20, $CH_4$: 8.0, CO: 1.4, $H_2$: balance | 940 | 10 | 10 |
| TiCNO-2 | $TiCl_4$: 4.0, $N_2$: 20, $CH_4$: 8.0, CO: 1.4, $H_2$: balance | 940 | 10 | 30 |
| TiCNO-3 | $TiCl_4$: 4.0, $N_2$: 20, $CH_4$: 8.0, CO: 1.4, $H_2$: balance | 940 | 10 | 60 |
| TiCNO-4 | $TiCl_4$: 4.0, $N_2$: 20, $CH_4$: 8.0, CO: 1.4, $H_2$: balance | 940 | 10 | 90 |
| TiCNO-5 | $TiCl_4$: 4.0, $N_2$: 40, $CH_4$: 8.0, CO: 1.4, $H_2$: balance | 940 | 10 | 10 |
| TiCNO-6 | $TiCl_4$: 4.0, $N_2$: 40, $CH_4$: 8.0, CO: 1.4, $H_2$: balance | 940 | 10 | 30 |
| TiCNO-7 | $TiCl_4$: 4.0, $N_2$: 40, $CH_4$: 8.0, CO: 1.4, $H_2$: balance | 940 | 10 | 60 |
| TiCNO-8 | $TiCl_4$: 4.0, $N_2$: 40, $CH_4$: 8.0, CO: 1.4, $H_2$: balance | 940 | 10 | 90 |
| $Al_2O_3$ | $AlCl_3$: 3.7, HCl: 0.7, $CO_2$: 4.3, $H_2S$: 0.3, $H_2$: balance | 950 | 7.5 | 380 |

TABLE 2

| | Coating layer | | | | | | | | | |
|---|---|---|---|---|---|---|---|---|---|---|
| | TiCNO layer | | | | | | | | | Cutting performance |
| Sample No. | Film formation condition | First protrusion | Second protrusion | Third protrusion | Beam | Average width of first protrusion (nm) | Average length of first protrusion (nm) | First composite protrusion (%) | Second composite protrusion (%) | $Al_2O_3$ layer Condition | Number of impacts (Ratio) |
|---|---|---|---|---|---|---|---|---|---|---|---|
| 1 | TiCNO-01 | Present | None | None | None | 30 | 150 | 0 | 0 | $Al_2O_3$ | 1 |
| 2 | TiCNO-02 + TiCNO-1 | Present | Present | None | None | 20 | 95 | 100 | 0 | $Al_2O_3$ | 1.2 |
| 3 | TiCNO-02 + TiCNO-2 | Present | Present | None | None | 30 | 140 | 100 | 0 | $Al_2O_3$ | 1.3 |
| 4 | TiCNO-02 + TiCNO-3 | Present | Present | Present | None | 35 | 160 | 94 | 6 | $Al_2O_3$ | 1.5 |
| 5 | TiCNO-02 + TiCNO-4 | Present | Present | Present | Present | 45 | 210 | 78 | 22 | $Al_2O_3$ | 1.7 |
| 6 | TiCNO-03 + TiCNO-5 | Present | Present | None | None | 30 | 65 | 100 | 0 | $Al_2O_3$ | 1.3 |
| 7 | TiCNO-03 + TiCNO-6 | Present | Present | None | None | 50 | 90 | 100 | 0 | $Al_2O_3$ | 1.4 |
| 8 | TiCNO-03 + TiCNO-7 | Present | Present | Present | None | 70 | 135 | 80 | 20 | $Al_2O_3$ | 1.6 |
| 9 | TiCNO-03 + TiCNO-8 | Present | Present | Present | Present | 90 | 180 | 67 | 33 | $Al_2O_3$ | 1.8 |

TABLE 3

| Sample No. | Coating layer | | | | | | |
|---|---|---|---|---|---|---|---|
| | Base layer Condition | First layer Condition | Second layer Condition | TiCNO layer | | | |
| | | | | Conditions | First protrusion | Second protrusion | Third protrusion |
| 10 | TiN | TiCN-1 | TiCN-2 | TiCNO-01 | Present | None | None |
| 11 | TiN | TiCN-1 | TiCN-2 | TiCNO-02 + TiCNO-1 | Present | Present | None |
| 12 | TiN | TiCN-1 | TiCN-2 | TiCNO-02 + TiCNO-2 | Present | Present | None |
| 13 | TiN | TiCN-1 | TiCN-2 | TiCNO-02 + TiCNO-3 | Present | Present | Present |
| 14 | TiN | TiCN-1 | TiCN-2 | TiCNO-02 + TiCNO-4 | Present | Present | Present |
| 15 | TiN | TiCN-1 | TiCN-2 | TiCNO-03 + TiCNO-5 | Present | Present | None |
| 16 | TiN | TiCN-1 | TiCN-2 | TiCNO-03 + TiCNO-6 | Present | Present | None |
| 17 | TiN | TiCN-1 | TiCN-2 | TiCNO-03 + TiCNO-7 | Present | Present | Present |
| 18 | TiN | TiCN-1 | TiCN-2 | TiCNO-03 + TiCNO-8 | Present | Present | Present |

| Sample No. | Beam | Coating layer | | | | | Cutting performance Number of impacts (Ratio) |
|---|---|---|---|---|---|---|---|
| | | TiCNO layer | | | | $Al_2O_3$ layer Condition | |
| | | Average width of first protrusion (nm) | Average length of first protrusion (nm) | First composite protrusion (%) | Second composite protrusion (%) | | |
| 10 | None | 40 | 200 | 0 | 0 | $Al_2O_3$ | 1 |
| 11 | None | 30 | 130 | 100 | 0 | $Al_2O_3$ | 1.9 |
| 12 | None | 40 | 190 | 100 | 0 | $Al_2O_3$ | 2.2 |
| 13 | None | 60 | 280 | 90 | 10 | $Al_2O_3$ | 2.5 |
| 14 | Present | 80 | 370 | 62 | 38 | $Al_2O_3$ | 2.8 |
| 15 | None | 60 | 120 | 100 | 0 | $Al_2O_3$ | 2.0 |
| 16 | None | 80 | 140 | 100 | 0 | $Al_2O_3$ | 2.3 |
| 17 | None | 100 | 180 | 66 | 34 | $Al_2O_3$ | 2.6 |
| 18 | Present | 120 | 220 | 54 | 46 | $Al_2O_3$ | 2.9 |

In all of Samples No. 1 to 9 shown in Table 2, a TiCNO layer was formed directly on the base member, and an $Al_2O_3$ layer was formed thereon. In Sample No. 1 where the TiCNO layer was formed at 970° C. for 60 minutes, the first protrusion was formed, but the beam, the second protrusion, and the third protrusion were not formed. That is, the beam, the first composite protrusion, and the second composite protrusion were not present.

Table 2 describes how many times the number of impact times of Sample No. 1 each sample withstood, based on the number of impact times of Sample No. 1. Each of Samples No. 5 and 9 including the beam obtained a cutting ability superior to those of the other samples.

In all of Samples No. 10 to 18 shown in Table 3, a base layer, a first TiCN layer, and a second TiCN layer were formed on the base member, and a TiCNO layer and an $Al_2O_3$ layer were further formed thereon.

Table 3 describes how many times the number of impact times of Sample No. 10 each sample withstood, based on the number of impact times of Sample No. 10. Each of Samples No. 14 and 18 including the beam obtained cutting performance superior to that of each of the other samples.

In a cross-section orthogonal to the surface of the base member, excellent cutting performance was obtained if the ratio of the number of second composite protrusions to the sum of the number of first composite protrusions and the number of second composite protrusions was large.

As described above, the coated tool of the present disclosure has cutting performance superior to that of the sample without the beam.

DESCRIPTION OF THE REFERENCE NUMERAL

1: Coated tool
2: Rake surface
3: Flank surface
4: Cutting edge
5: Base member
7: Coating layer
9: TiCNO layer
11: $Al_2O_3$ layer
13a: First protrusion
13b: Second protrusion
13c: Third protrusion
14a: First composite protrusion
14b: Second composite protrusion
15: First TiCN layer
17: Second TiCN layer
19: Surface layer
101: Cutting tool
103: Pocket
105: Holder
107: Fixing screw

The invention claimed is:

1. A coated tool, comprising:
a base member; and
a coating layer located on a surface of the base member, wherein
the coating layer comprises a TiCNO layer and an $Al_2O_3$ layer,
the $Al_2O_3$ layer is located in contact with the TiCNO layer at a position farther from the base member than the TiCNO layer is,
the TiCNO layer comprises a plurality of first protrusions that project toward the $Al_2O_3$ layer, and a beam that extends in a direction intersecting a direction in which the plurality of first protrusions project, the beam connecting the plurality of first projections,
the TiCNO layer comprises a second composite protrusion comprising a third protrusion that projects from a second protrusion in a direction intersecting the direction in which the second protrusion projects, and
the thickness of the TiCNO layer is in a range of 10 nm to 35 nm excluding the plurality of first protrusions, the second protrusion and the third protrusion.

2. The coated tool according to claim 1, wherein the first protrusions are connected by a plurality of the beams.

3. The coated tool according to claim 1, wherein a direction in which the beam extends is inclined relative to a facing surface of the base member facing the coating layer.

4. The coated tool according to claim 1, wherein the TiCNO layer comprises a first composite protrusion comprising a second protrusion that projects from the first protrusion in a direction intersecting the direction in which the first protrusion projects.

5. The coated tool according to claim 1, wherein a ratio of the number of the second composite protrusions to a sum of the number of the first composite protrusions and the number of the second composite protrusions is 20% or more in a cross-section orthogonal to the surface of the base member.

6. The coated tool according to claim 1, wherein an average width of bases of the first protrusions is 40 to 200 nm, and an average height of the first protrusions is 50 to 300 nm in a cross-section orthogonal to the surface of the base member.

7. The coated tool according to claim 1, wherein an average length of the first protrusions is three times or less an average width of bases of the first protrusions.

8. The coated tool according to claim 1, wherein the coating layer comprises a first TiCN layer, a second TiCN layer, the TiCNO layer and the $Al_2O_3$ layer sequentially from the base member.

9. A cutting tool, comprising:
a holder extending from a first end toward a second end and comprising a pocket on a side of the first end; and
the coated tool according to claim 1, the coated tool being located in the pocket.

10. The coated tool according to claim 8, the first TiCN layer contains a higher carbon content ratio than the second TiCN layer.

11. The coated tool according to claim 8, wherein the first TiCN layer is thicker than the second TiCN layer.

12. The coated tool according to claim 11, wherein a thickness of the first TiCN layer is 2 μm to 15 μm and the second TiCN layer is 10 nm to 900 nm.

13. The coated tool according to claim 8, carbon content ratio of the first TiCN layer is set to 0.52 to 0.57 and the carbon content ratio of the second TiCN layer is set to 0.42 to 0.51.

14. The coated tool according to claim 8, wherein the first TiCN layer includes 45 to 60% by atom of titanium, 15 to 29% by atom of carbon, and 22 to 35% by atom of nitrogen.

15. The coated tool according to claim 14, wherein the second TiCN layer includes 48 to 60% by atom of titanium, 10 to 20% by atom of carbon, and 15 to 25% by atom of nitrogen.

16. The coated tool according to claim 8, wherein
the carbon content ratio of the first TiCN layer is set to 15 to 29% by atom and the nitrogen content is set to 22 to 35% by atom, and
the carbon content ratio of the second TiCN layer is set to 13 to 24% by atom and the nitrogen content is set to 23 to 35% by atom.

* * * * *